(12) United States Patent
Schultz et al.

(10) Patent No.: US 11,934,764 B2
(45) Date of Patent: Mar. 19, 2024

(54) ROUTING AND MANUFACTURING WITH A MINIMUM AREA METAL STRUCTURE

(71) Applicants: ADVANCED MICRO DEVICES, INC., Santa Clara, CA (US); ATI TECHNOLOGIES ULC, Markham (CA)

(72) Inventors: Richard Schultz, Fort Collins, CO (US); Wenyi Yin, Santa Clara, CA (US); Tanmoy Saha, Markham (CA)

(73) Assignees: ADVANCED MICRO DEVICES, INC., Santa Clara, CA (US); ATI TECHNOLOGIES ULC, Markham (CA)

( * ) Notice: Subject to any disclaimer, the term of this patent is extended or adjusted under 35 U.S.C. 154(b) by 133 days.

(21) Appl. No.: 17/362,662

(22) Filed: Jun. 29, 2021

(65) Prior Publication Data

US 2022/0414311 A1    Dec. 29, 2022

(51) Int. Cl.
*G06F 30/398*     (2020.01)
*G06F 30/392*     (2020.01)
*H01L 27/02*      (2006.01)

(52) U.S. Cl.
CPC .......... *G06F 30/398* (2020.01); *G06F 30/392* (2020.01); *H01L 27/0207* (2013.01)

(58) Field of Classification Search
CPC . G03F 1/36; G03F 7/0002; G03F 1/70; G03F 7/70433; G03F 7/705; G03F 1/68; G03F 7/70275; G03F 7/70291; G03F 7/70391; G03F 7/70441; G03F 7/70475; G03F 7/70508; G03F 1/30; G03F 1/72; G03F 1/84; G03F 7/70283; G03F 7/70491; G03F 7/70616; G03F 7/70625; G03F 7/70633; G03F 7/7065; G03F 7/70666; G03F 9/7076; G03F 1/00; G03F 1/26; G03F 1/34; G03F 7/70641; G03F 7/70791; G03F 1/38; G03F 7/70525; G03F 7/706841; G06F 30/398; G06F 30/20; G06F 30/39; G06F 2119/18; G06F 30/00; G06F 30/327; G06F 30/392; G06F 16/128; G06F 30/394; G06F 30/3953; G06F 30/36; G06F 30/373; G06F 2119/06; G06F 30/3308; G06F 2111/04; G06F 30/33; G06F 11/008; G06F 2111/20; G06F 30/333; G06F 2119/12; G06F 30/367; G06F 30/31; G06F 30/337; G06F 30/27; G06F 2111/06; H01L 2224/83191; H01L 24/32; H01L 2224/48; H01L 23/53238; H01L 2221/68359; H01L 2224/16013; H01L 2224/16014; H01L 23/5386; H01L 24/26; H01L 27/0207; H01L 27/11807; H01L 2924/00;
(Continued)

(56) References Cited

U.S. PATENT DOCUMENTS

| | | | |
|---|---|---|---|
| 2015/0170961 A1* | 6/2015 | Romero | H01L 21/28506 438/641 |
| 2016/0125120 A1* | 5/2016 | Yu | H01L 21/027 716/52 |
| 2020/0104448 A1* | 4/2020 | Yang | G06F 30/392 |

* cited by examiner

*Primary Examiner* — Binh C Tat

(57) ABSTRACT

Manufacturing a semiconductor chip based on redefining tolerance rules to create an otherwise prohibited structure including redefining a tolerance rule to permit creation of a minimum area metal trench structure violating the tolerance rule during a routing operation; and fabricating the minimum area metal trench structure on the semiconductor substrate based on the redefined tolerance rule.

20 Claims, 18 Drawing Sheets

(58) Field of Classification Search
CPC ........... H01L 2924/0002; H01L 21/027; H01L 21/32139; H01L 23/5221; H01L 23/5283; H01L 21/76808; H01L 21/76811; H01L 21/76813; H01L 21/76838; H01L 21/76885; H01L 22/12; H01L 22/20; H01L 23/5222; H01L 23/5226; H01L 23/528; H01L 23/53295
USPC .................................................... 716/50–56
See application file for complete search history.

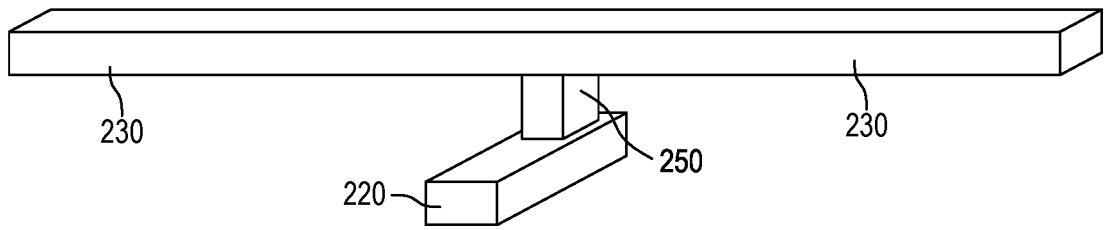
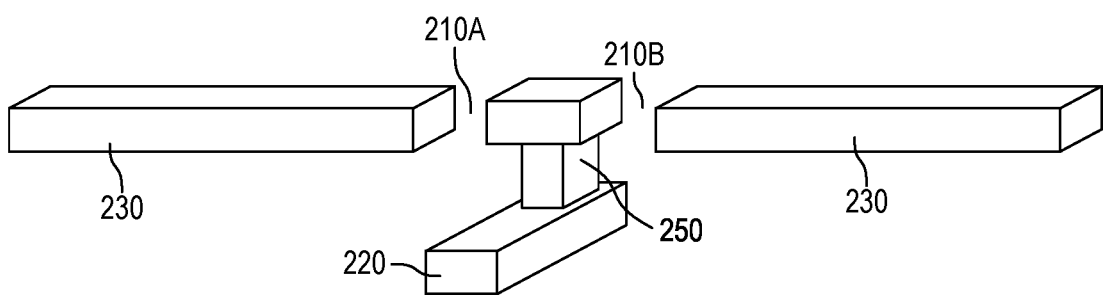
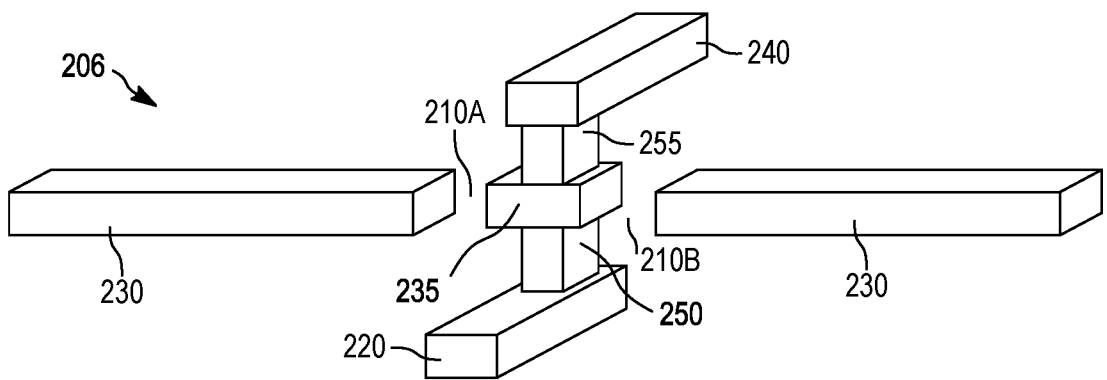
FIG. 2

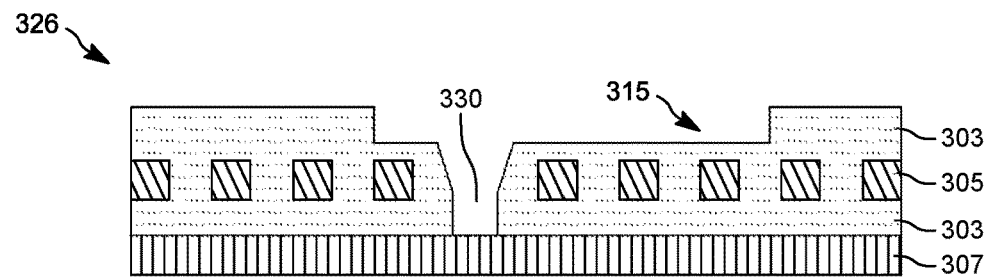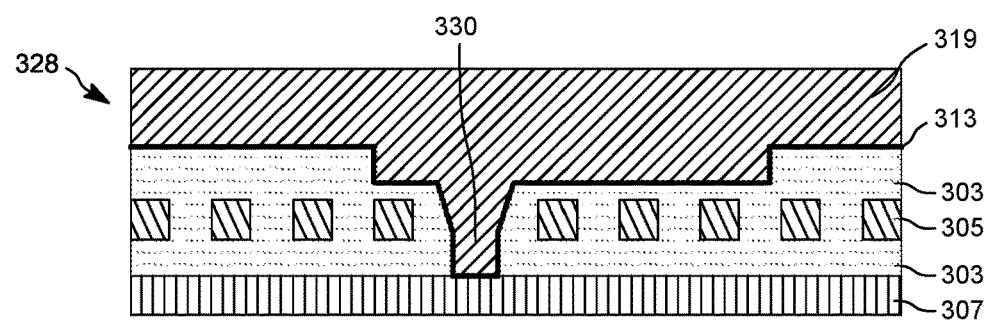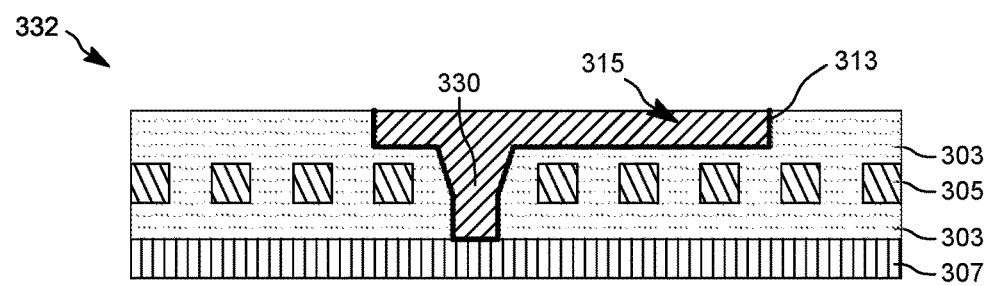
SUPER VIA CROSS SECTION PROCESS FLOW COPPER CMP
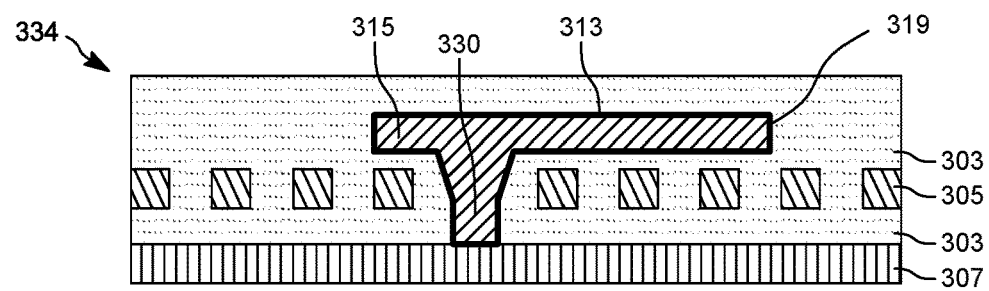
FIG. 3D Redefine A Tolerance Rule To Permit Creation Of A Minimum Area Metal Trench Structure Violating The Tolerance Rule During A Routing Operation
710

Fabricate The Minimum Area Metal Trench Structure On A Semiconductor Substrate Based On A Redefined Tolerance Rule
720

Remove A Portion Of The First Photoresist Layer From The Nitride Layer
910

Etch A Metal Trench In The Nitride Layer Where The Portion Of The First Photoresist Layer Was Removed
920

FIG. 9

```
┌─────────────────────────────────────────────────────────────┐
│  Redefine A Tolerance Rule To Permit Creation Of A Minimum  │
│  Area Metal Trench Structure Violating The Tolerance Rule   │
│              During A Routing Operation                      │
│                          710                                 │
└─────────────────────────────────────────────────────────────┘
                              │
                              ▼
┌─────────────────────────────────────────────────────────────┐
│  Fabricate The Minimum Area Metal Trench Structure On A     │
│  Semiconductor Substrate Based On A Redefined Tolerance Rule│
│                          720                                 │
│                                                              │
│   ┌──────────────────────────────────────────────────────┐  │
│   │  Apply A Conductive Layer On The Oxide Layer And     │  │
│   │       Filling The Via With The Conductive Layer       │  │
│   │                        1110                           │  │
│   └──────────────────────────────────────────────────────┘  │
│                              │                               │
│                              ▼                               │
│   ┌──────────────────────────────────────────────────────┐  │
│   │                                                       │  │
│   │     Polish The Conductive Layer From The Oxide Layer  │  │
│   │                        1120                           │  │
│   │                                                       │  │
│   └──────────────────────────────────────────────────────┘  │
│                              │                               │
│                              ▼                               │
│   ┌──────────────────────────────────────────────────────┐  │
│   │  Apply An Additional Amount Of The Oxide Layer On    │  │
│   │  The Conductive Layer, Wherein The Conductive Layer  │  │
│   │  Forms A Third Metal Layer With The Via, The Via     │  │
│   │  Electrically Connecting The Third Metal Layer To    │  │
│   │         The First Metal Layer In The Oxide Layer     │  │
│   │                        1130                           │  │
│   └──────────────────────────────────────────────────────┘  │
└─────────────────────────────────────────────────────────────┘
```

FIG. 11

```
┌─────────────────────────────────────────────────────────────────────┐
│  Redefine A Tolerance Rule To Permit Creation Of A Minimum Area     │
│  Metal Trench Structure Violating The Tolerance Rule During A       │
│  Routing Operation                                                  │
│                              710                                    │
└─────────────────────────────────────────────────────────────────────┘
                                 │
                                 ▼
┌─────────────────────────────────────────────────────────────────────┐
│  Fabricate The Minimum Area Metal Trench Structure On A             │
│  Semiconductor Substrate Based On A Redefined Tolerance Rule        │
│                              720                                    │
│  ┌───────────────────────────────────────────────────────────────┐  │
│  │  Apply A Photoresist Layer To A Second Metal Layer Having     │  │
│  │  A First Via, The Via Is Self-Aligned And Is Electrically     │  │
│  │  Connected To A First Metal Layer                             │  │
│  │                         1210                                  │  │
│  └───────────────────────────────────────────────────────────────┘  │
│                                │                                    │
│                                ▼                                    │
│  ┌───────────────────────────────────────────────────────────────┐  │
│  │  Remove A First Section And A Second Section In The           │  │
│  │  Photoresist Layer                                            │  │
│  │                         1220                                  │  │
│  └───────────────────────────────────────────────────────────────┘  │
│                                │                                    │
│                                ▼                                    │
│  ┌───────────────────────────────────────────────────────────────┐  │
│  │  Cut A First Metal Trench And A Second Metal Trench In The    │  │
│  │  Second Metal Layer Exposed From The First Section And The    │  │
│  │  Second Section In The Photoresist Layer                      │  │
│  │                         1230                                  │  │
│  └───────────────────────────────────────────────────────────────┘  │
└─────────────────────────────────────────────────────────────────────┘
```

FIG. 12

```
┌─────────────────────────────────────────────────────────────┐
│  Redefine A Tolerance Rule To Permit Creation Of A Minimum  │
│  Area Metal Trench Structure Violating The Tolerance Rule   │
│               During A Routing Operation                    │
│                           710                               │
└─────────────────────────────────────────────────────────────┘
                              │
                              ▼
┌─────────────────────────────────────────────────────────────┐
│  Fabricate The Minimum Area Metal Trench Structure On A     │
│   Semiconductor Substrate Based On A Redefined Tolerance    │
│                           Rule                              │
│                           720                               │
│  ┌───────────────────────────────────────────────────────┐  │
│  │ Apply A Metal Oxide On The Second Metal Layer And     │  │
│  │     Filling The First Metal Trench And The Second     │  │
│  │                    Metal Trench                       │  │
│  │                        1310                           │  │
│  └───────────────────────────────────────────────────────┘  │
│                              │                              │
│                              ▼                              │
│  ┌───────────────────────────────────────────────────────┐  │
│  │    Remove The Metal Oxide From The Second Metal       │  │
│  │                        Layer                          │  │
│  │                        1320                           │  │
│  └───────────────────────────────────────────────────────┘  │
│                              │                              │
│                              ▼                              │
│  ┌───────────────────────────────────────────────────────┐  │
│  │      Apply An Oxide Layer To The Second Metal Layer   │  │
│  │                        1330                           │  │
│  └───────────────────────────────────────────────────────┘  │
│                              │                              │
│                              ▼                              │
│  ┌───────────────────────────────────────────────────────┐  │
│  │ Apply A Third Metal Layer To The Oxide Layer, Wherein │  │
│  │ The Third Metal Layer Includes A Second Via, Wherein  │  │
│  │  The Second Via Is A Self-Aligned Via And Is          │  │
│  │       Electrically Connected To The Second Metal Layer│  │
│  │                        1340                           │  │
│  └───────────────────────────────────────────────────────┘  │
└─────────────────────────────────────────────────────────────┘
```

FIG. 13

ROUTING AND MANUFACTURING WITH A MINIMUM AREA METAL STRUCTURE

BACKGROUND

As both semiconductor manufacturing processes advance and on-die geometric dimensions reduce, semiconductor chips provide more functionality and performance while consuming less space. To achieve these high device densities, small features on semiconductor wafers are required. In fact, a significant amount of effort toward scaling down device/geometric dimensions on semiconductor wafers have been made. While many advances have been made, design issues still arise with modem techniques in processing and integrated circuit design that limit potential benefits. For example, capacitive coupling, electromigration, leakage currents and processing yield are some issues which affect the placement of devices and the routing of signals across an entire die of a semiconductor chip. Thus, these issues have the potential to delay completion of the design and affect the time to market.

In order to shorten the design cycle for semiconductor chips, manual full-custom designs are replaced with automation where possible such as, for example, using an electronic design automation ("EDA") and/or computer aided design ("CAD") systems. A designer provides a description of a functional unit or a complex gate in a high-level description language. A synthesis tool receives the logic description and provides the logical netlist. The logical netlist is used by a place-and-route (PNR) tool to provide physical layout. The place-and-route tool uses a cell layout library to provide the physical layout. The place and route tool places a cells side-by-side and uses a routing tool to electrically connect the cells in a specified way to implement corresponding logic of the IC design.

BRIEF DESCRIPTION OF THE DRAWINGS

FIG. 2 is a portion of an example process flow for constructing a manufacturable post-metal cut and oxide-filled minimum area metal trench structure based on redefined design rules according to some embodiments.

FIG. 3D is a portion of an example process flow for constructing a manufacturable minimum area metal trench structure with an extended via based on redefined design rules according to some embodiments.

FIG. 9 sets forth a flow chart illustrating another example method for manufacturing a minimum area metal trench structure based on redefined design rules according to some embodiments.

FIG. 11 sets forth a flow chart illustrating another example method for manufacturing a minimum area metal trenflch structure based on redefined design rules according to some embodiments.

FIG. 12 sets forth a flow chart illustrating another example method for manufacturing a minimum area metal trench structure based on redefined design rules according to some embodiments.

FIG. 13 sets forth a flow chart illustrating another example method for manufacturing a minimum area metal trench structure based on redefined design rules according to some embodiments.

DETAILED DESCRIPTION

Figure 1A:
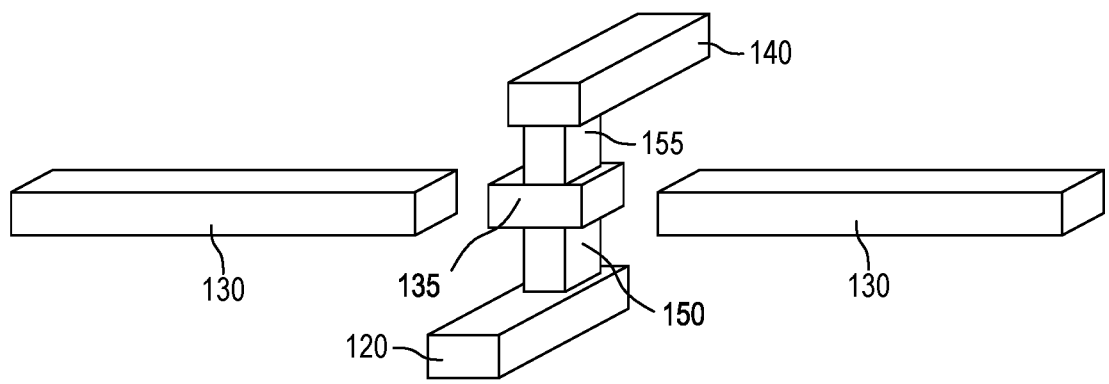
FIG. 1A is a diagram of an example of a minimum area metal trench structure with two vias violating design rules during routing according to some embodiments.

In some embodiments, a method of manufacturing a semiconductor chip based on redefining tolerance rules to create an otherwise prohibited structure includes redefining a tolerance rule to permit creation of a minimum area metal trench structure violating the tolerance rule during a routing operation; and fabricating the minimum area metal trench structure on a semiconductor substrate based on a redefined tolerance rule.

In some embodiments, the method of manufacturing a semiconductor chip based on redefining tolerance rules to create an otherwise prohibited structure includes applying a nitride layer to an oxide layer of the semiconductor substrate, the oxide layer havening a first metal layer and a second metal layer; and applying a first photoresist layer to the nitride layer. In some embodiments, the method of manufacturing a semiconductor chip based on redefining tolerance rules to create an otherwise prohibited structure includes removing a portion of the first photoresist layer from the nitride layer; and etching a metal trench in the nitride layer where the portion of the first photoresist layer was removed.

In some embodiments, the method of manufacturing a semiconductor chip based on redefining tolerance rules to create an otherwise prohibited structure includes striping the first photoresist layer from the nitride layer; applying a second photoresist layer to the nitride layer and the oxide layer exposed in the metal trench; removing a portion of the second photoresist layer to expose the oxide layer; and etching the oxide layer to create a via.

In some embodiments, the method of manufacturing a semiconductor chip based on redefining tolerance rules to create an otherwise prohibited structure includes stripping the second photoresist layer from the first nitride layer and the oxide layer; etching the metal trench in the first nitride layer and the oxide layer. The vias is extended from the second metal layer to the first metal layer in the oxide layer, the first metal layer being beneath the second metal layer in the oxide layer; and removing the nitride layer from the oxide layer. The nitride layer forming a metal barrier on the second metal layer.

In some embodiments, the method of manufacturing a semiconductor chip based on redefining tolerance rules to create an otherwise prohibited structure includes applying a conductive layer on the oxide layer and filling the via with the conductive layer; and polishing the conductive layer from the oxide layer. In some embodiments, the method of manufacturing a semiconductor chip based on redefining tolerance rules to create an otherwise prohibited structure includes applying an additional amount of the oxide or "oxide layer" on the conductive layer. The conductive layer forms a third metal layer on the via and the via electrically connects the third metal layer to the first metal layer in the oxide layer. The via passing through the second metal layer in the oxide (e.g., the oxide layer).

In some embodiments, a method of using redefined tolerance rules to create an otherwise prohibited structure on a wafer is disclosed. The method includes performing a routing operation to create a minimum area metal trench structure based on one or more redefined design rules. generating a routing design file based on the routing operation. The method includes replacing each instance of the minimum area metal trench structure in the routing design file with an alternative metal trench structure.

In some implementations, the method also includes identifying one or more design rules the minimum area metal trench structure violates prior to performing the routing operation, where the minimum area metal trench structure has a minimum size, shape, and pattern prohibited by the one or more design rules. In some implementations, the method also includes redefining one or more design rules to permit creation of the minimum area metal trench structure during the routing operation. In some implementations, the method also includes identifying all instances of the minimum area metal trench structure in the routing design file. In some implementations, the method also includes updating the routing design file with the alternative metal trench structure. In some implementations, the method also includes fabricating the alternative metal trench structure on a semiconductor substrate based on replacing each instance of the minimum area metal trench structure in the routing design file. The alternative metal trench structure is at least an extended via that electrically connects a third metal layer to the first metal layer in an oxide layer, wherein the extended via traverses through a second metal layer in the oxide layer.

In some embodiments, a semiconductor chip (e.g., a semiconductor chip device) having an otherwise prohibited structure during routing includes: a substrate having an oxide layer and a plurality of metal layers; a minimum area metal trench structure in the oxide layer; and an extended via in the minimum area metal trench structure electrically connecting a first metal layer with a third metal layer. The extended via traversing through the oxide layer and a second metal layer.

In some embodiments, the extended via is created based upon a redefined tolerance rule. In some embodiments, the extended via replaces a section in the second metal layer. In some embodiments, the first metal layer is beneath the second metal layer in the oxide layer. In some embodiments, the third metal layer is above the second metal layer. In some embodiments, the minimum area metal trench structure has a minimum size, shape, and pattern prohibited by a tolerance rule during the routing. In some embodiments, the minimum area metal trench structure is a metal pad in the second metal layer.

In some embodiments, a semiconductor chip (e.g., a semiconductor chip device) having an otherwise prohibited structure during routing includes: a substrate having an oxide layer and a plurality of metal layers; a minimum area metal trench structure in the oxide layer of the substrate; and an extended via in the minimum area metal trench structure electrically connecting a first metal layer with a third metal layer in the oxide layer; wherein the extended via traversing through the oxide layer and a second metal layer of the plurality of metal layers.

In some embodiments, the extended via is created based upon a redefined tolerance rule. In some embodiments, the third metal layer is positioned on the oxide layer. In some embodiments, the third metal layer includes an upper conductive barrier, a lower conductive barrier, and side-wall conductive barriers. In some embodiments, the second metal layer is in the oxide layer. In some embodiments, the oxide layer is positioned on the first metal layer. In some embodiments, the third metal layer includes a metal trench in a portion of the oxide layer of the semiconductor substrate, wherein the extended via extends from the metal trench in the third metal layer and electrically connects the third metal layer to the first metal layer.

In some embodiments, the semiconductor chip having an otherwise prohibited structure during routing includes: an additional oxide layer positioned on the third metal layer, wherein the oxide layer and the additional oxide layer collectively encase the third metal layer.

In some embodiments, a semiconductor chip (e.g., a semiconductor chip device) having an otherwise prohibited structure during routing includes: a substrate having an oxide layer a first metal layer, a second metal layer, and a third metal layer; a minimum area metal trench structure in the second layer, wherein the minimum area metal trench structure includes a metal pad, a first metal trench, and a second metal trench in the second metal layer; a first self-aligned electrically connected to the first metal layer and the metal pad of the minimum area metal trench structure; and a second self-aligned electrically connected to the third metal layer and the metal pad of the minimum area metal trench structure.

In some embodiments, the minimum area metal trench structure is created based upon a redefined tolerance rule. In some embodiments, the first metal trench is located on a first side of the metal pad in the second layer and the second metal trench is located on a second side of the metal pad in the second layer, wherein the first metal trench and the second metal trench encase the metal pad. In some embodiments, the first metal trench and the second metal trench filled with a conductive material. In some embodiments, the first metal layer is below the second metal layer, the second metal layer is located above the first metal layer and below the third metal layer, the third metal layer is located above the second metal layer and below the fourth metal layer.

In some embodiments, a method of manufacturing a semiconductor chip based on redefining tolerance rules to create an otherwise prohibited structure includes redefining a tolerance rule to permit creation of a minimum area metal trench structure violating the tolerance rule during a routing operation; and fabricating the minimum area metal trench structure on the semiconductor substrate based on the redefined tolerance rule.

In some embodiments, the method of manufacturing a semiconductor chip based on redefining tolerance rules to create an otherwise prohibited structure includes applying a photoresist layer to a second metal level having a via, the via is a self-aligned via and is electrically connected to a first metal level.

In some embodiments, the method of manufacturing a semiconductor chip based on redefining tolerance rules to create an otherwise prohibited structure includes removing a first section and a second section in the photoresist layer; and cutting a first metal trench and a second metal trench in the second metal level exposed from the first section and the second section in the photoresist layer. A minimum area metal trench pad is formed between the first metal trench and the second metal trench.

In some embodiments, the method of manufacturing a semiconductor chip based on redefining tolerance rules to create an otherwise prohibited structure includes applying a metal oxide on the second metal level and filling the first metal trench and the second metal trench; and removing the metal oxide from the second metal level.

In some embodiments, the method of manufacturing a semiconductor chip based on redefining tolerance rules to create an otherwise prohibited structure includes applying an oxide layer to the third metal layer. In some embodiments, the method of manufacturing a semiconductor chip based on redefining tolerance rules to create an otherwise prohibited structure includes applying a third metal level to the oxide layer, and third metal level includes a via that is a self-aligned via and is electrically connected to the second metal layer, or more specifically, the minimum area metal trench pad that is between the first metal trench and the second metal trench.

In some embodiments, the metal layers or "wires," metal pads, and/or conductive layers, as described herein, may be manufactured using a variety of conductive metal including, but not limited to, copper, gold, silver, platinum, palladium, combinations of these or other materials or semiconductor design specifications.

To ensure the methods of manufacturing a semiconductor chip, the semiconductor foundry typically supplies the designer with a set of design rules that apply to a specified technology process, whereby these design rules specify various parameters pertaining to spacing, width, enclosure, and extension for the physical elements within the physical layout of the IC design. A design rule check (DRC) tool thus applies the specified design rules to the semiconductor design to verify that all design rules are met and thus the semiconductor may be fabricated as designed using the specified technology process. For example, a design rule set may include a tip-to-tip minimum distance requirement that specifies that unless the tips of two metal segments in the same track in abutting cells are immediately adjacent to each other (that is, the metal runs continuously across the abutting cell boundaries), the tips must be a minimum distance apart that typically represents the width of the metal cut layer. Otherwise, if the tip spacing is not generated by a metal cut, the designer must ensure the tips are spaced an adequate distance apart which is typically larger—sometimes significantly larger—than the cut layer's width.

It should be noted that standard cell layouts use at least one power rail for the supply voltage connections also referred to as the voltage drain supply "VDD" power rail and one power rail for the ground connections also referred to as the voltage source supply "VSS" power rail. In some cases, the power and ground rails use relatively long wires utilizing multiple metal layers such as horizontal metal zero, vertical metal one, horizontal metal two and vertical metal three in addition to the corresponding vias. In other cases, fixed location posts are used within the standard cell to make the power and ground connections.

In general, routing or "wire routing" is the process of determining location of each active element of an IC or component on the semiconductor chip. That is, using the EDA or CAD system, wire routing may be used to guide routers for layout optimization such as, for example, mapping out an intended path for each connection with the actual wires being formed during the fabrication. The wires are typically layers of conductive metal material such as, for example, copper or aluminum that are separated by layers of insulating material such as silicon dioxide. The metal layers may be patterned using photolithographic techniques to form the wires for interconnecting the electrical elements in an integrated circuit (IC). However, nanometer physical design is facing increasing challenges from process limitations, such as lithography printability, topology variation, random defects, and the like. Since many process limitations are interconnection-related, the routing step is considered important to address these challenges. Yet, even the routing operations, using the EDA or CAD system, may result in manufacturability challenges based on the design rules, as illustrated in FIG. 1A.

FIG. 1A is a block diagram of a non-routable minimum area metal trench structure 100 of a semiconductor chip. The non-routable minimum area metal trench structure 100 includes a first metal layer 120, a second metal layer 130, a metal pad 135 (e.g., a minimum area metal trench pad in the second metal layer) in the second metal layer 130, a third metal layer 140, and a first via 150 and a second via 155. The first metal layer 120 may be beneath the second metal layer 130 and the metal pad 135. The third metal layer 140 may be layered above the second metal layer 130 and the first metal layer 120.

The third metal layer 140 may include the second via 155 where the second via 155 is a self-aligned via. The metal pad 135 may also be considered as the second metal layer 130 and include the first via 150 where the first via 150 is also a self-aligned via.

As depicted, the non-routable minimum trench structure 100 is designed during the routing. However, due to the minimum size, shape, length, width, area, and/or patterns of the non-routable minimum trench structure 200 a design rule may be violated. As such, the routing may either fail and stop the actual routing or may complete the actual routing while noting or indicating the rule violation.

Thus, the GDS file of the routing may be analyzed to identify the non-routable minimum trench structure 100. A post processing operation may be performed on the GDS to adjust and redefine the design rule (e.g., tolerance rule) to enable manufacturing of an alternative minimum trench structure on the semiconductor substrate based on the redefined design rule, as depicted in FIG. 1B.

Figure 1B:
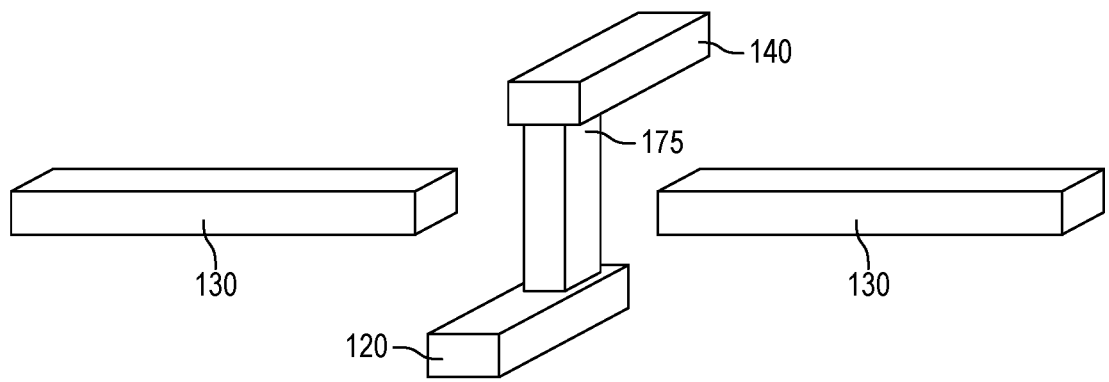
FIG. 1B is a diagram of an example of a manufacturable minimum area metal trench structure with an extended via based on redefined design rules according to some embodiments.

FIG. 1B is a block diagram of a manufacturable minimum area metal trench structure 185 based on a redefined design rule according to some embodiments. The minimum area metal trench structure 185 includes the first metal layer 120, the second metal layer 130, the third metal layer 140, and an extended via 175. The extended via 175 replaces the metal pad 135, and the first via 150 and the second via 155. The extended via 175 may be self-aligned with the third metal layer 140 and electrically connects the third metal layer 140 with the first metal layer 120. In this way, the original routing mapping of FIG. 1A may be manufactured based on the redesigned design rule to create and use the extended via 175, which may be of a defined height, shape, size, area, and/or pattern based on, for example, a semiconductor manufacturers design specification. More specifically, post processing of an integrated circuit design file such as, for example, a graphic data system ("GDS") file of a CAD program, may include identifying the metal pad 135 of FIG. 1A that triggers the routing to fail or stop based. Once this metal pad 135 is identified, the design rule may be redefined to enable the manufacturing of the minimum area metal trench structure 185 of FIG. 1B, which was previously non-routable.

In an additional aspect, FIG. 2 is a portion of an example process flow 200 for constructing a manufacturable post-metal cut and oxide-filled minimum area metal trench structure based on redefined design rules according to some embodiments. For example, the exemplary process flow set forth in FIG. 2 may be used to construct the non-routable minimum area metal trench structure 100 of FIG. 1A according to some embodiments.

Beginning with FIG. 2, at step 202, a first metal layer 220, a first via 250, and a second metal layer 230 may be fabricated according to a redesigned design rule. At step 204, two cuts such as, for example, cut 210A and cut 210B may be cut in the second metal layer, wherein the cut 210A forms a first metal trench and the cut 210B forms a second metal trench in the second metal layer 230. A minimum area metal trench pad 235 is formed between the cut 210A and the cut 210B in the second metal layer 230. At step 206, a third metal layer 240 may be applied and created with a second via 255, which is a self-aligned via. The second via 255 electrically connects the third metal layer 240 and the minimum area metal trench pad 235.

For further explanation, FIGS. 3A-D set forth an exemplary process flow for constructing a semiconductor wafer structure with a manufacturable minimum area metal trench structure with an extended via based on redefined design rules according to various embodiments. For example, the exemplary process flow set forth in FIG. 3A-3D may be used to construct the manufacturable minimum area metal trench structure with an extended via based on redefined design rules according to some embodiments.

As a preliminary matter and to further illustrate a final outcome of the process flow of FIGS. 3A-3D, block diagram 300 is a top view of a final assembled example semiconductor device section manufactured and constructed with a minimum area metal trench structure with an extended via based on redefined design rules upon completion of the process flow. Block diagram 302 is a cross-sectional view of the final assembled example semiconductor device manufactured and constructed with the manufacturable minimum area metal trench structure with the extended via based on redefined design rules according to some embodiments.

Block diagrams 300 and 302 depicts a first metal layer 307, a second metal layer 305, and a third metal layer 313, and an extended via 330 (e.g., an extended via or "super via"), and a via 350 connects the second metal layer 305 and the third metal layer 313. That is, block diagram 302 illustrates a cross section of the newly created extended via 330 or "super via." Block diagram 302 also depicts the oxide layer 303 to further illustrate the final outcome of the manufacturable minimum area metal trench structure with the extended via based on redefined design rules as illustrated in FIG. 1B according to some embodiments.

Turning now to the process flow, at step 304, the first metal layer 307, the second metal layer 305, and the oxide layer 303 may be fabricated. The first metal layer 307 beneath the oxide layer 303. The second metal layer 305 being in, or within, the oxide layer 303. The second metal layer 305 being positioned above the first metal layer 307. At step 306, a nitride layer 309 may be applied and deposited (e.g., a nitride deposition) to the oxide layer 303 of a semiconductor substrate in the semiconductor chip. At step 308, a first photoresist layer 311A may be applied and deposited (e.g., a resist deposition) to the nitride layer 309.

Figure 3A:
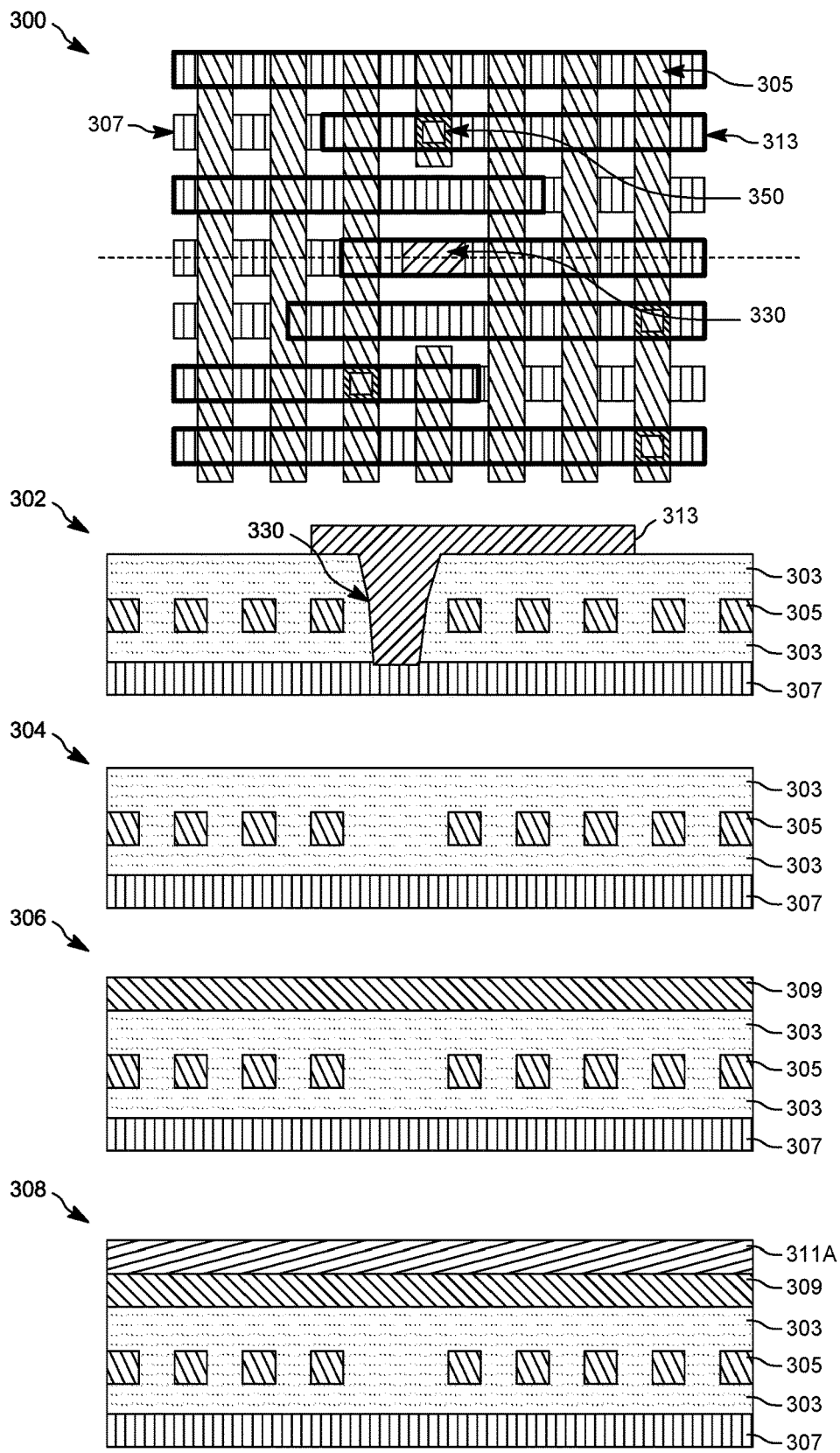
FIG. 3A is a portion of an example process flow for constructing a manufacturable minimum area metal trench structure with an extended via based on redefined design rules according to some embodiments.
Figure 3B:
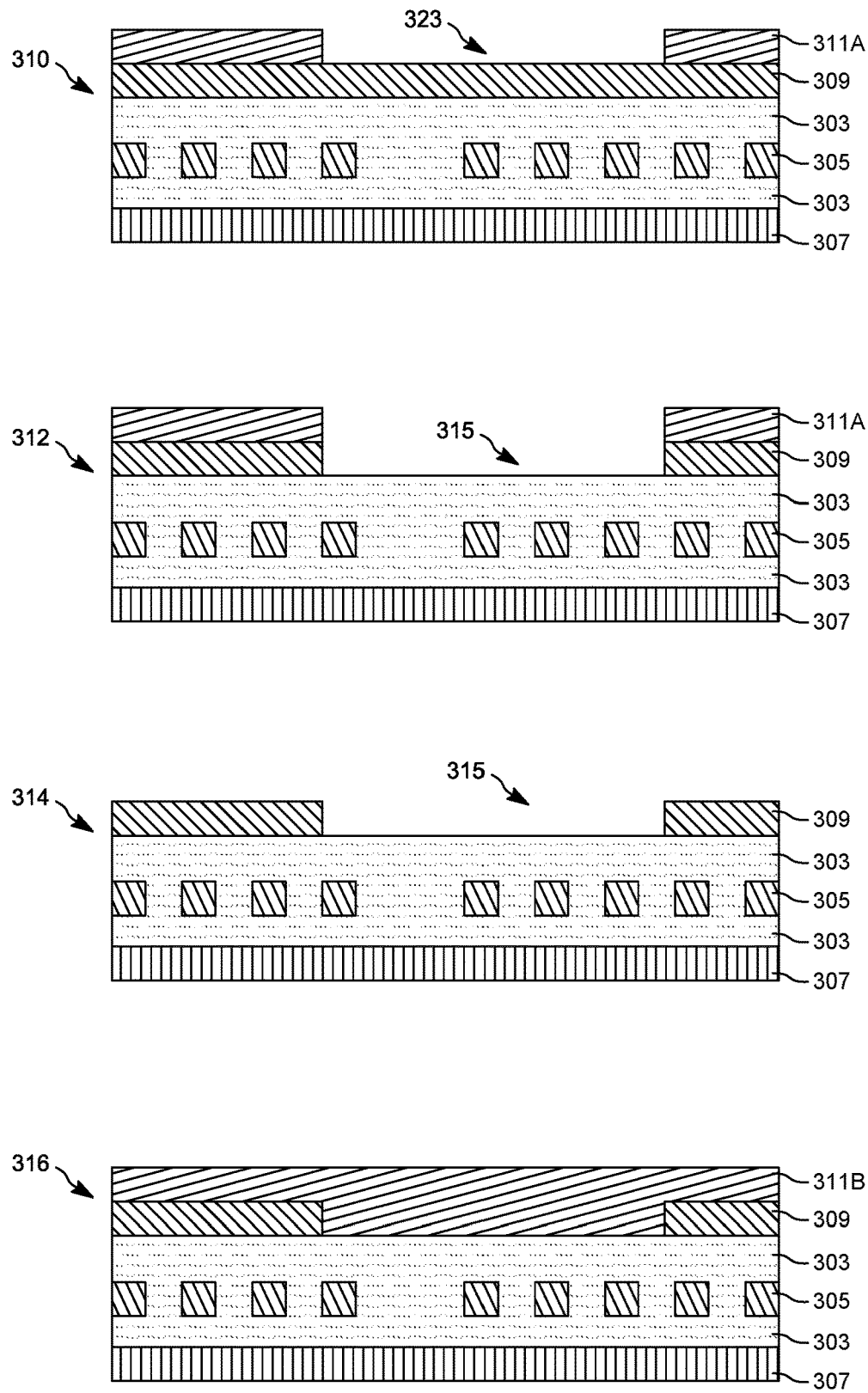
FIG. 3B is a portion of an example process flow for constructing a manufacturable minimum area metal trench structure with an extended via based on redefined design rules according to some embodiments.

Moving to FIG. 3B, at step 310, a portion 323 of the photoresist layer may be removed from the nitride layer 309. At step 312, a metal trench 315 may be etched in the nitride layer 309 (e.g., a nitride hard mask etch) where the portion 323 of the first photoresist layer 311A was removed. It should be noted that the hard mask such as, for example, the nitride hard mask is thin enough so that it can be etched without eroding a patterned photoresist above it.

At step 314, the first photoresist layer 311A may be stripped from the nitride layer 309. At step 316, a second photoresist layer 311B may be applied to the nitride layer 309 and the oxide layer 303 exposed in the metal trench 315. It should be noted the first photoresist layer 311A and the second photoresist layer 311B may be the same type of photoresist layer but are referred to herein as first photoresist layer 311A and second photoresist layer 311B in FIG. 3A-3D for illustrative convenience. More accurately, the photoresist layer 311 is applied at least two times during the process flow and thus referred to as a first photoresist layer 311A and 311B by way of example only.

Figure 3C:
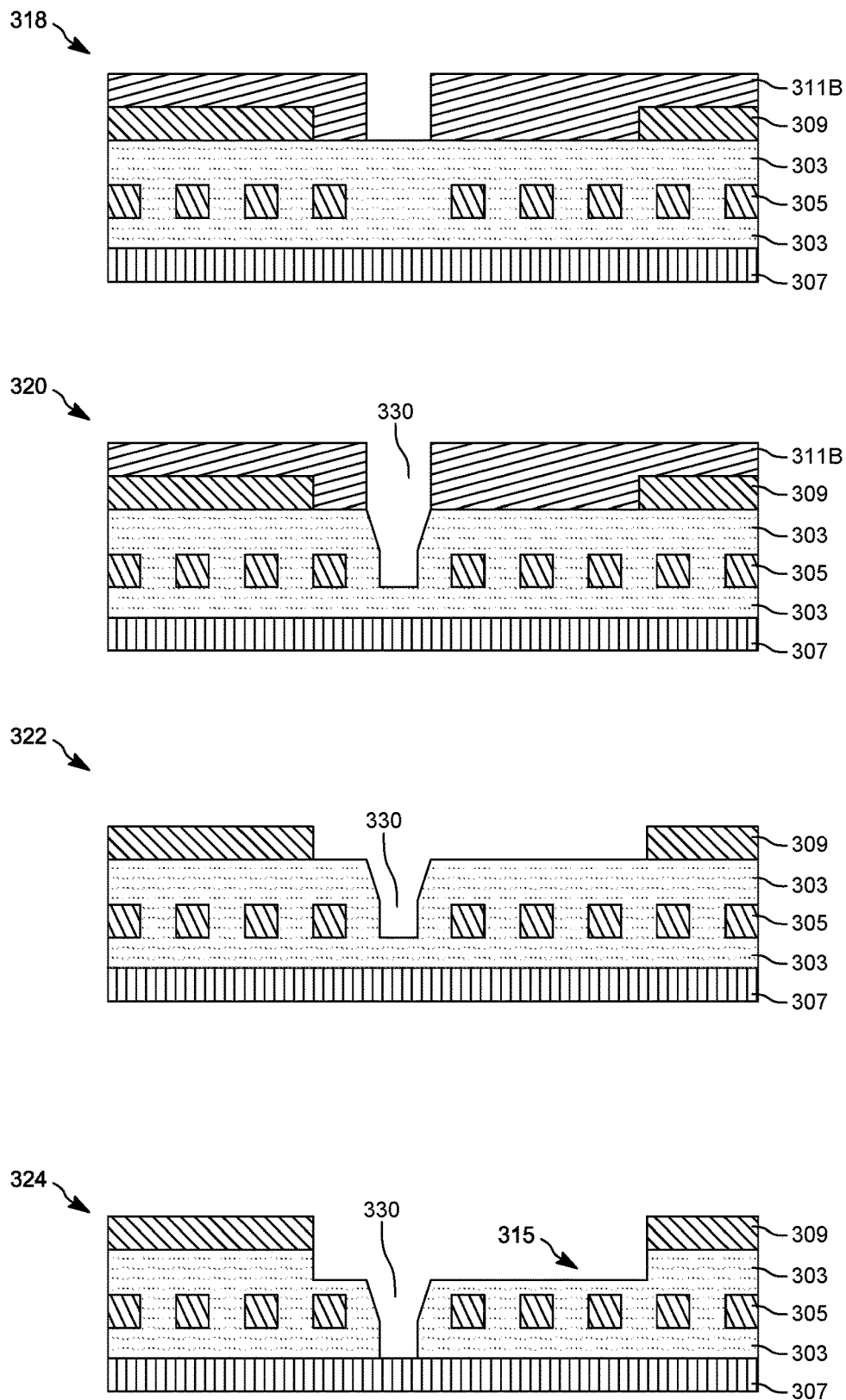
FIG. 3C is a portion of an example process flow for constructing a manufacturable minimum area metal trench structure with an extended via based on redefined design rules according to some embodiments.

Moving to FIG. 3C, at step 318, a portion of the second photoresist layer 311B may be removed and developed to expose the oxide layer 303. At step 320, the oxide layer 303 may be etched to create an extended via 330 (e.g., an initial via etch). At step 322, the second photoresist layer 311B may be stripped from the nitride layer 309 and the oxide layer 303. At step 324, the metal trench 315 in the nitride layer 309 and the oxide layer 303 may be etched. The extended vias 330 is extended from the second metal layer 305 to the first metal layer 307 in the oxide layer 303 (e.g., a metal trench etch and via etch).

Moving to FIG. 3D, at step 326, the nitride layer 309 may be stripped from the oxide layer 303. At step 328, a conductive layer 319 may be applied on the oxide layer 303 and filling the extended via 330 with the conductive layer 319 (e.g., filling with copper and creating a copper barrier). The conductive layer 319 forming the third metal layer 313. The third metal layer 313 may be a copper metal layer having an upper copper barrier, lower copper barrier, and side-wall copper barriers. It should be noted that each metal layer such as, for example, the second metal layer 305 and the first metal layer 307 also have upper, lower, and side-wall metal barriers. At step 332, the conductive layer 319 may be polished from the oxide layer 303.

At step 334, an additional amount of the oxide layer 303 may be applied on the conductive layer 319 (which is the third metal layer), which is depicted with an upper metal barrier formation and oxide deposition. The conductive layer forms a third metal layer on the extended via 330. The extended via 330 electrically connecting the first metal layer 307 to the third metal layer 313.

Figure 4A:
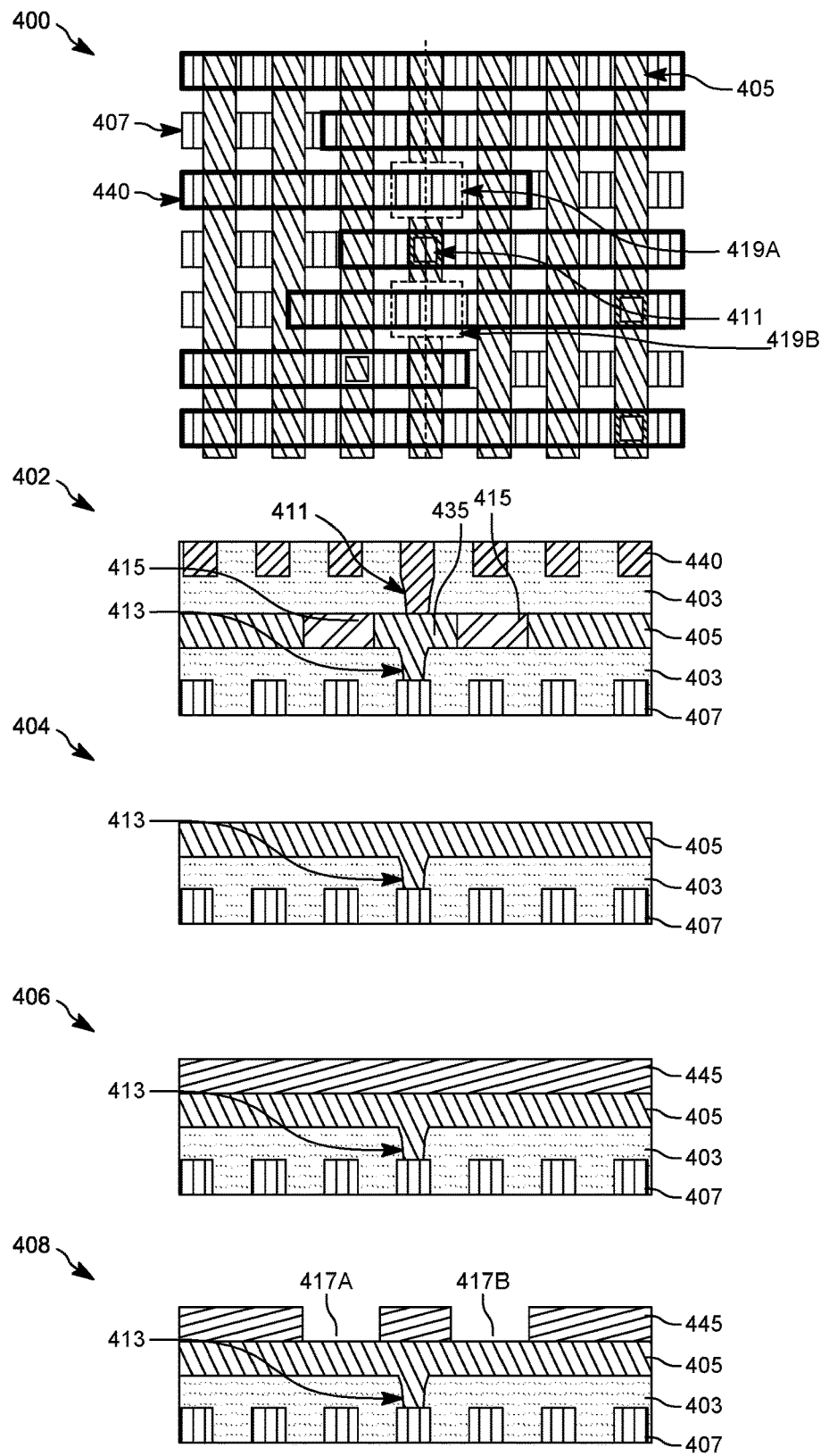
FIG. 4A is a portion of an example process flow for constructing a post-metal cut and oxide-filled minimum area metal trench structure based on redefined design rules according to some embodiments.
Figure 4B:
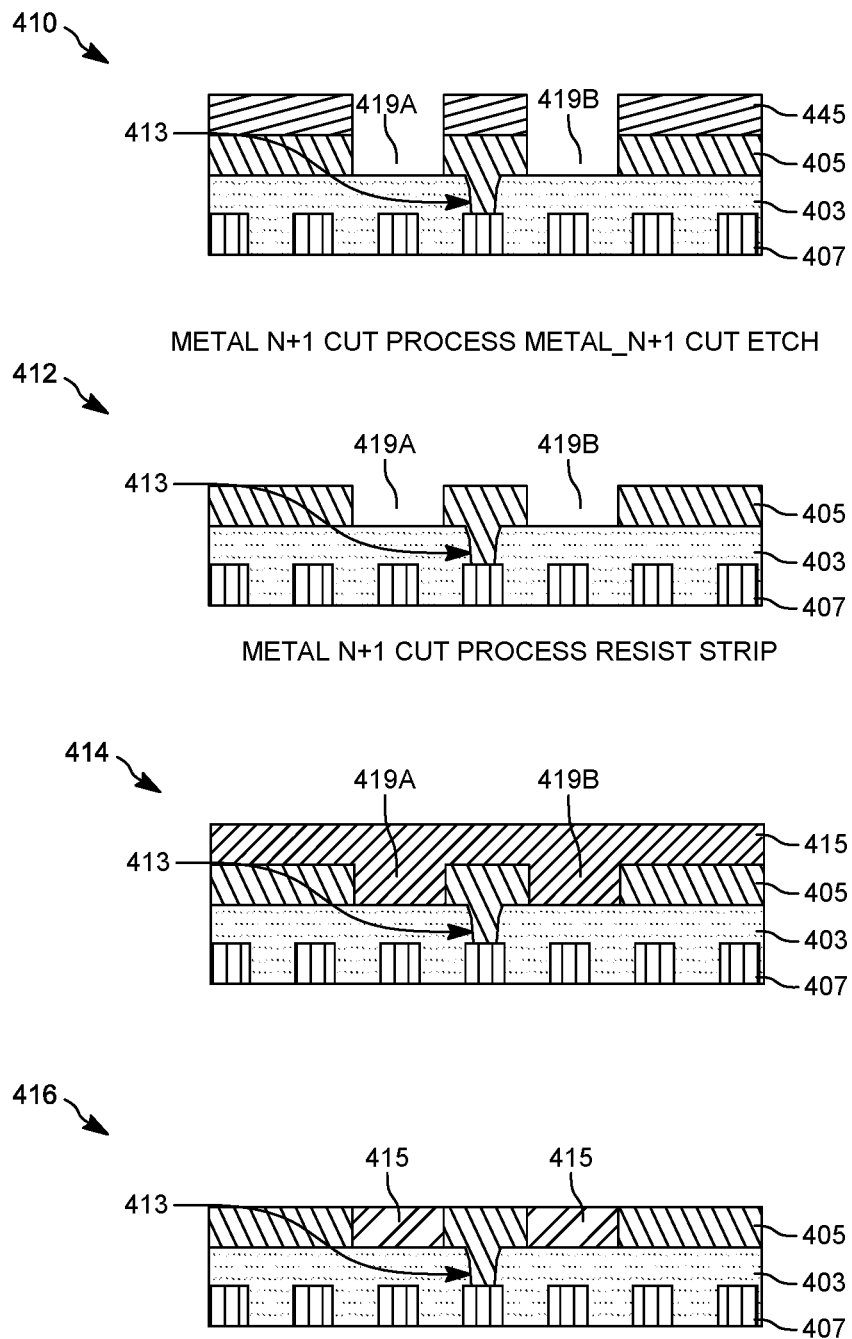
FIG. 4B is a portion of an example process flow for constructing a post-metal cut and oxide-filled minimum area metal trench structure based on redefined design rules according to some embodiments.
Figure 4C:
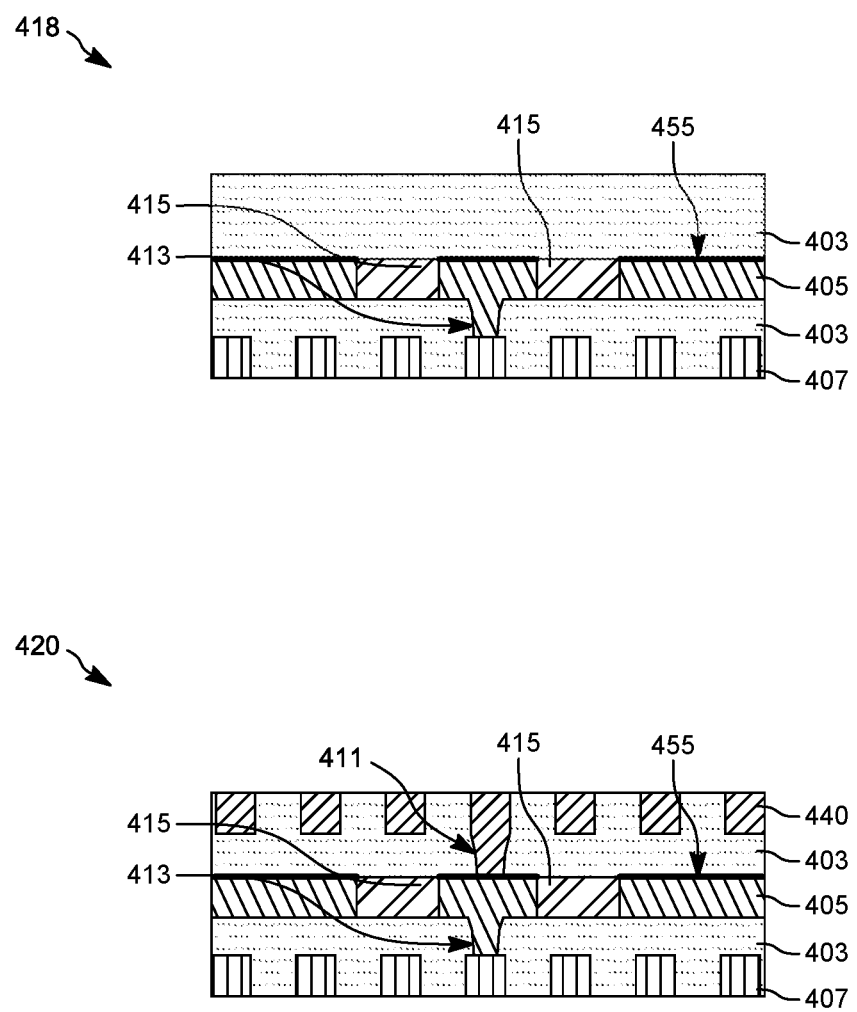
FIG. 4C is a portion of an example process flow for constructing a post-metal cut and oxide-filled minimum area metal trench structure based on redefined design rules according to some embodiments.

For further explanation, FIGS. 4A-4C set forth an exemplary process flow for constructing a constructing a post-metal cut and oxide-filled minimum area metal trench structure based on redefined design rules according to various embodiments.

As a preliminary matter and to further illustrate the process flow of FIGS. 4A-4C, block diagram 400 is a top view of a final assembled example semiconductor device constructed with a post-metal cut and oxide-filled minimum area metal trench structure based on redefined design rules upon completion of the process flow of FIGS. 4A-4C. Block diagram 402 is a cross-sectional view of the final assembled example semiconductor device constructed with the post-metal cut and oxide-filled minimum area metal trench structure based on redefined design rules according to some embodiments. That is, block diagrams 400 and 402 depicts a first metal layer 407, a second metal layer 405, and a third metal layer 440, a first via 413, which is a self-aligned via, a second via 411 (also self-aligned), and a metal pad 435 (e.g., a minimum area metal trench pad in the second metal layer 405), and metal oxide 415 filling the metal cuts in the second metal layer 405, as will be illustrated below.

Turning now to the process flow, at step 404, the first metal layer 407, the second metal layer 405, and the oxide layer 403 may be fabricated. At step 406, a photoresist layer 445 may be applied to the second metal layer 405 having the first via 413, the first via 413 electrically connected to the first metal layer 407. At step 408, a first section 417A and a second section 417B may be removed in the photoresist layer 445.

Moving to FIG. 4B, at step 410, a first metal trench 419A and a second metal trench 419B in the second metal layer 405 may be exposed from the first section 417A and the second section 417B in the photoresist layer 445. At step 412, the photoresist layer 445 may be stripped from the second metal layer 405.

At step 414, a metal oxide 415 (e.g., an aluminum oxide "AIO") may be applied and deposited on the second metal layer 405 and filling the first metal trench 419A and the second metal trench 419B. At step 416, the metal oxide 415 may be polished and removed from the second metal layer 405 such as, for example, AIO chemical mechanical polishing ("CMP"). It should be noted that the metal oxide 415 remains, however, in the first metal trench 419A and the second metal trench 419B of the second metal layer 405.

Moving to FIG. 4C, at step 418, an additional amount of the oxide layer 403 such as, for example, interlayer dielectric ("ILD") oxide deposition, may be applied and deposited on the second metal layer 405, which has an upper metal barrier 455 of the second metal layer 405. At step 420, the third metal layer 440 may be applied to the oxide layer 403. Third metal layer 440 may include the second via 411 and the second via 411 is electrically connected to second metal layer 405 and/or the upper metal barrier 455.

Figure 5:
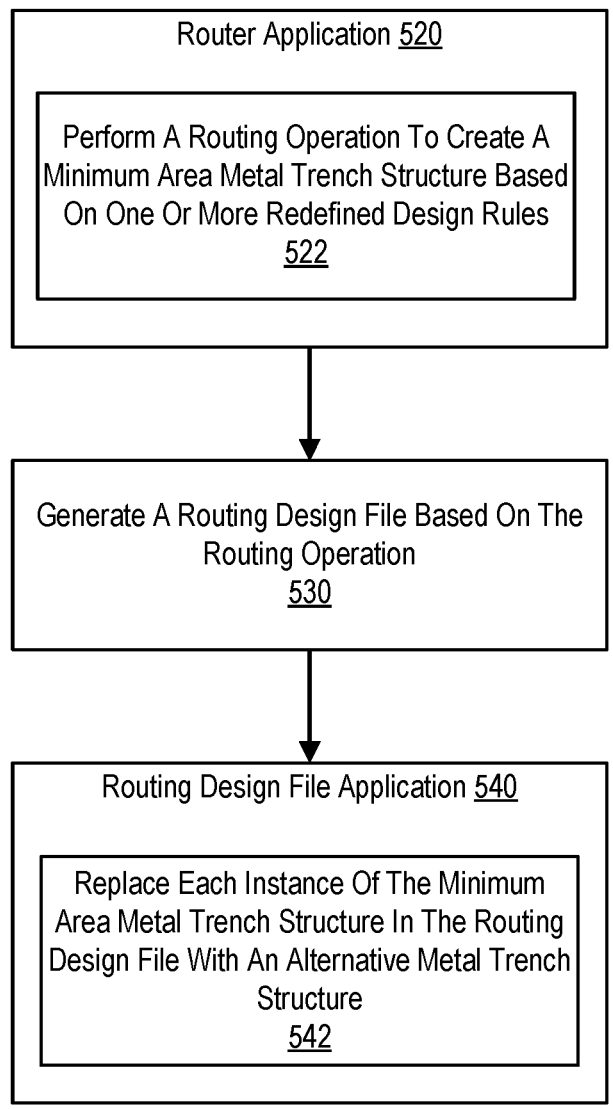
FIG. 5 sets forth a flow chart illustrating an example method for using redefined tolerance rules to create an otherwise prohibited structure on a wafer according to some embodiments.

For further explanation, FIG. 5 sets forth a flow chart illustrating an example method of using redefined tolerance rules to create an otherwise prohibited structure on a wafer in accordance with some embodiments of the present disclosure. The example method of FIG. 5 includes performing 522, in a routing application 520, a routing operation to create a minimum area metal trench structure based on one or more redefined design rules.

In some implementations, the minimum area metal trench structure is the non-routable minimum trench structure 100 and has a minimum size, shape, and pattern, which would trigger a rule violation during the routing. In some examples, the routing application 520 contains a list of various redefined design rules. In some examples, the design rules may be default or non-default design rules that specify constraints on the layout of an integrated circuit. For example, the design rules constraints may indicate a minimum spacing distance between adjacent routed conductive segments. Thus, design rules constraints may indicate each location of an active element of integrated circuits. More specifically, the design rules constraints may indicate a width a wire and a wire length of the conductive segments and the line widths. These design rules may provide the necessary or desired constraints for adding wire needed to connect placed components/active elements on the integrated circuits. Since the task of the routing operation is to create a design such that all design rules are obeyed. If the design rules are violated the design will fail such as, for example, the design will fail by not connecting terminals that should be connected (an open), or by mistakenly connecting two terminals that should not be connected (a short), or by creating a design rule violation such as, for example, creating the minimum area metal trench structure.

The design rules may be identified and redefined in order to permit the routing of the minimum area metal trench structure, which would otherwise violate one of the design rules. The router application 520 may be included in an EDA or CAD system.

The example method of FIG. 5 also includes generating 530 a routing design file based on the routing operation. In some implementations, the routing design file is GDS file of the routing operation in the EDA or CAD system. The example method of FIG. 5 also includes replacing 542, in a routing design file application 540, each instance of the minimum area metal trench structure in the routing design file with an alternative metal trench structure. In some implementations, a post-processing operation is performed on the routing design file where each instance of the minimum area metal trench structure is identified. The post-processing operation may be executed in an EDA or CAD system using one or more computing devices (not shown for illustrative convenience).

In some implementations, the alternative metal trench structure, is a minimum area metal trench structure with an extended via as described in FIGS. 3A-3D and is to be manufactured on a wafer, and may electrically connect a third metal layer in an oxide layer to a first metal layer in the oxide layer via an extended via, where the extended via traverses through a second metal layer in the oxide layer. Alternatively, the alternative metal trench structure is a post-metal cut and oxide-filled minimum area metal trench structure as described in FIGS. 4A-4C, is to be manufactured on a wafer, and is a minimum area metal trench pad is formed between a first metal trench and a second metal trench in a second metal level.

Figure 6:
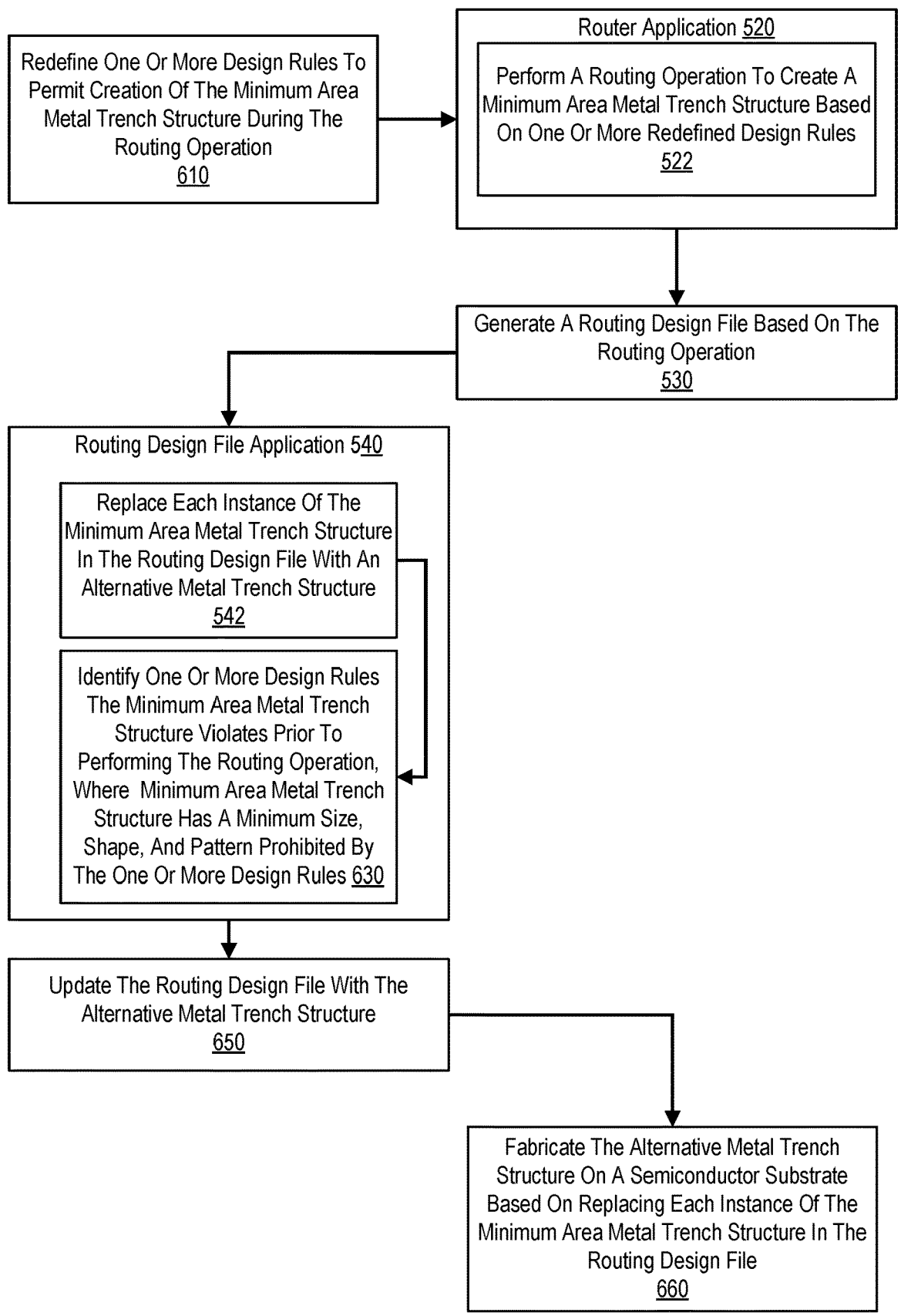
FIG. 6 sets forth a flow chart illustrating another example method using redefined tolerance rules to create an otherwise prohibited structure on a wafer according to some embodiments.

For further explanation, FIG. 6 sets forth a flow chart illustrating an example method of using redefined tolerance rules to create an otherwise prohibited structure on a wafer in accordance with some embodiments of the present disclosure. Like the example method of FIG. 5, the example method of FIG. 5 also includes performing 522, in a routing application 520, a routing operation to create a minimum area metal trench structure based on one or more redefined design rules; generating 530 a routing design file based on the routing operation; and replacing 542, in a routing design file application 540, each instance of the minimum area metal trench structure in the routing design file with an alternative metal trench structure.

The example method of FIG. 6 also includes redefining 610 one or more design rules to permit creation of the minimum area metal trench structure during the routing operation. In some implementations, the router application 520 may receive instruction to identify one or more design rules that would be violated during the routing operation of the minimum area metal trench structure. These redefined design rules may be based on a manufacturers design specifications or instructions and redefined using one or more computing system in the EDA or CAD system. These design rules may then be redefined, prior to the actual routing 522, to permit creation of the artificially minimum area metal trench structure.

The example method of FIG. 6 also includes identifying 630 all instances of the minimum area metal trench structure in the routing design file. That is, each instance of the minimum area metal trench structure may be marked during the routing operation noting the violation of a design rule and identified during the post-processing. The identifying 630 may be part of the post-processing of the GDS file of the routing operation in the EDA or CAD system such as, for example, the routing design file application 540.

The example method of FIG. 6 also includes identifying 630 one or more design rules the minimum area metal trench structure violates prior to performing the routing operation, wherein the minimum area metal trench structure has a minimum size, shape, and pattern prohibited by the one or more design rule.

The example method of FIG. 6 also includes updating 650 the routing design file with the alternative metal trench structure. The example method of FIG. 6 also includes fabricating 660 the alternative metal trench structure on a semiconductor substrate based on replacing each instance of the minimum area metal trench structure in the routing design file. The fabricating 660 of the alternative metal trench structure on a semiconductor substrate may be performed based on a manufacture's semiconductor substrate fabrication process. For example, the fabrication process may include a multiple-step sequence of photolithographic and chemical processing steps such as, for example, thermal oxidation, surface passivation, electroplating, metal deposition, etc., during with the electrical circuit is created on the semiconductor substrate based on the routing operations. In one aspect, the semiconductor substrate is a wafer of a semiconductor material such as, for example, silicon, gallium arsenide, germanium, or other substrate material.

Thus, the fabrication the alternative metal trench structure on the semiconductor substrate enables manufacturing of the minimum area metal trench structure based on the redefined design rules. The alternative metal trench structure represents the minimum area metal trench structure having a minimum size and spacing that otherwise would have been prevented from being manufactured based on the wire routing design violations, which now enables the semiconductor processes to manufacture and fabricate smaller minimum sizes and tighter spacing to reduce costs and improve performance due to an increase in transistor density.

Figure 7:
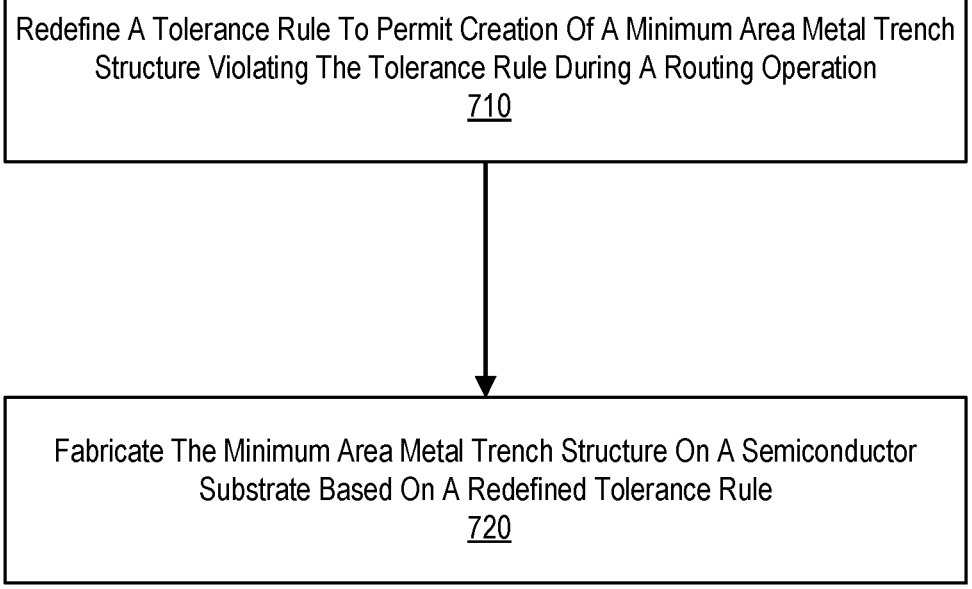
FIG. 7 sets forth a flow chart illustrating an example method for manufacturing a minimum area metal trench structure based on redefined design rules according to some embodiments.

For further explanation, FIG. 7 sets forth a flow chart illustrating an example method of manufacturing a minimum area metal trench structure based on redefined design rules to create an otherwise prohibited structure in accordance with some embodiments of the present disclosure. The example method of FIG. 7 includes redefining 710 a tolerance rule to permit creation of a minimum area metal trench structure violating the tolerance rule during a routing operation. In some implementations, the design rules (e.g., the tolerance rules) may be design routing rules used to indicate one or more rules, parameters, or constraints on a circuit layout for electronic design automation. In some implementations, the minimum area metal trench structure is the non-routable minimum trench structure 100 and has a minimum size, shape, and pattern, which would trigger a rule violation during the routing. These rules may be identified and redefined in order to permit the routing of the minimum area metal trench structure. The example method of FIG. 7 also includes fabricating 720 the minimum area metal trench structure on a semiconductor substrate based on a redefined tolerance rule.

Figure 8:
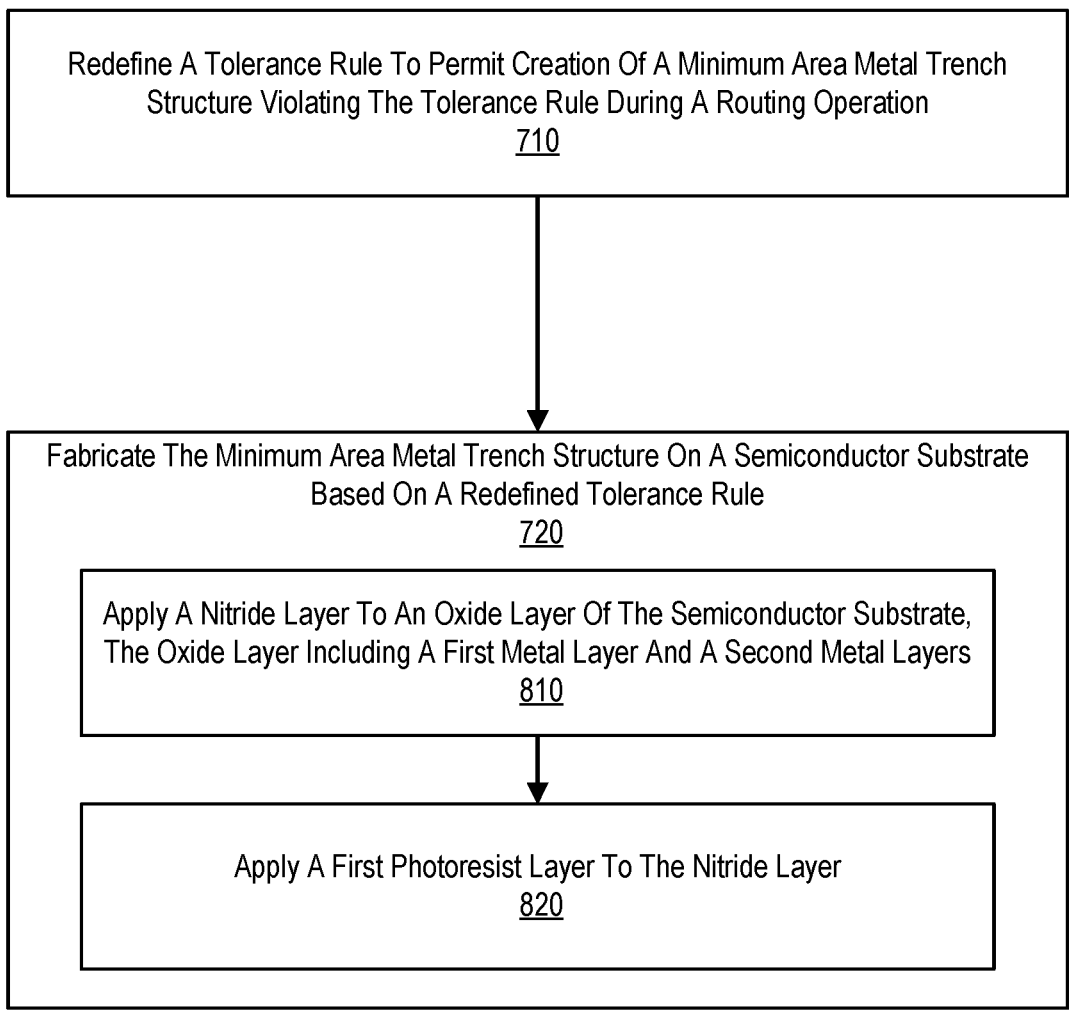
FIG. 8 sets forth a flow chart illustrating another example method for manufacturing a minimum area metal trench structure based on redefined design rules according to some embodiments.

For further explanation, FIG. 8 sets forth a flow chart illustrating an additional example method of manufacturing a minimum area metal trench structure based on redefined design rules to create an otherwise prohibited structure in accordance with some embodiments of the present disclosure. Like the example method of FIG. 7, the example method of FIG. 8 also includes redefining 710 a tolerance rule to permit creation of a minimum area metal trench structure violating the tolerance rule during a routing operation; and fabricating 720 the minimum area metal trench structure on a semiconductor substrate based on a redefined tolerance rule.

The example method of FIG. 8 also includes applying 810 a nitride layer to an oxide layer of the semiconductor substrate, the oxide layer including a first metal layer and a second metal layer. The nitride layer provides an etch stop during subsequent polishing of the wafer. The example method of FIG. 8 also includes applying 820 a first photoresist layer (e.g., a lithographic material) to the nitride layer.

It should be noted that the photoresist layer is a photoresist material or layer associated with conventional lithographic technologies is often utilized to selectively form various IC structures, regions, and layers. Generally, the patterned photoresist material can be utilized to define doping regions, implant regions or other structures associated with an integrated circuit (IC). A conventional lithographic system is generally utilized to pattern photoresist material to form gate stacks or structures.

In one aspect, as used herein, applying a metal layer may include, for example, depositing and forming the metal layer using an electrochemical deposition technique, such as electroplating or electroless plating.

For further explanation, FIG. 9 sets forth a flow chart illustrating an additional example method of manufacturing a minimum area metal trench structure based on redefined design rules to create an otherwise prohibited structure in accordance with some embodiments of the present disclosure. Like the example method of FIG. 7, the example method of FIG. 9 also includes redefining 710 a tolerance rule to permit creation of a minimum area metal trench structure violating the tolerance rule during a routing operation; and fabricating 720 the minimum area metal trench structure on a semiconductor substrate based on a redefined tolerance rule.

The example method of FIG. 9 also includes removing 910 a portion of the first photoresist layer from the nitride layer. The example method of FIG. 9 also includes etching 920 a metal trench in the nitride layer where the portion of the first photoresist layer was removed.

Figure 10:
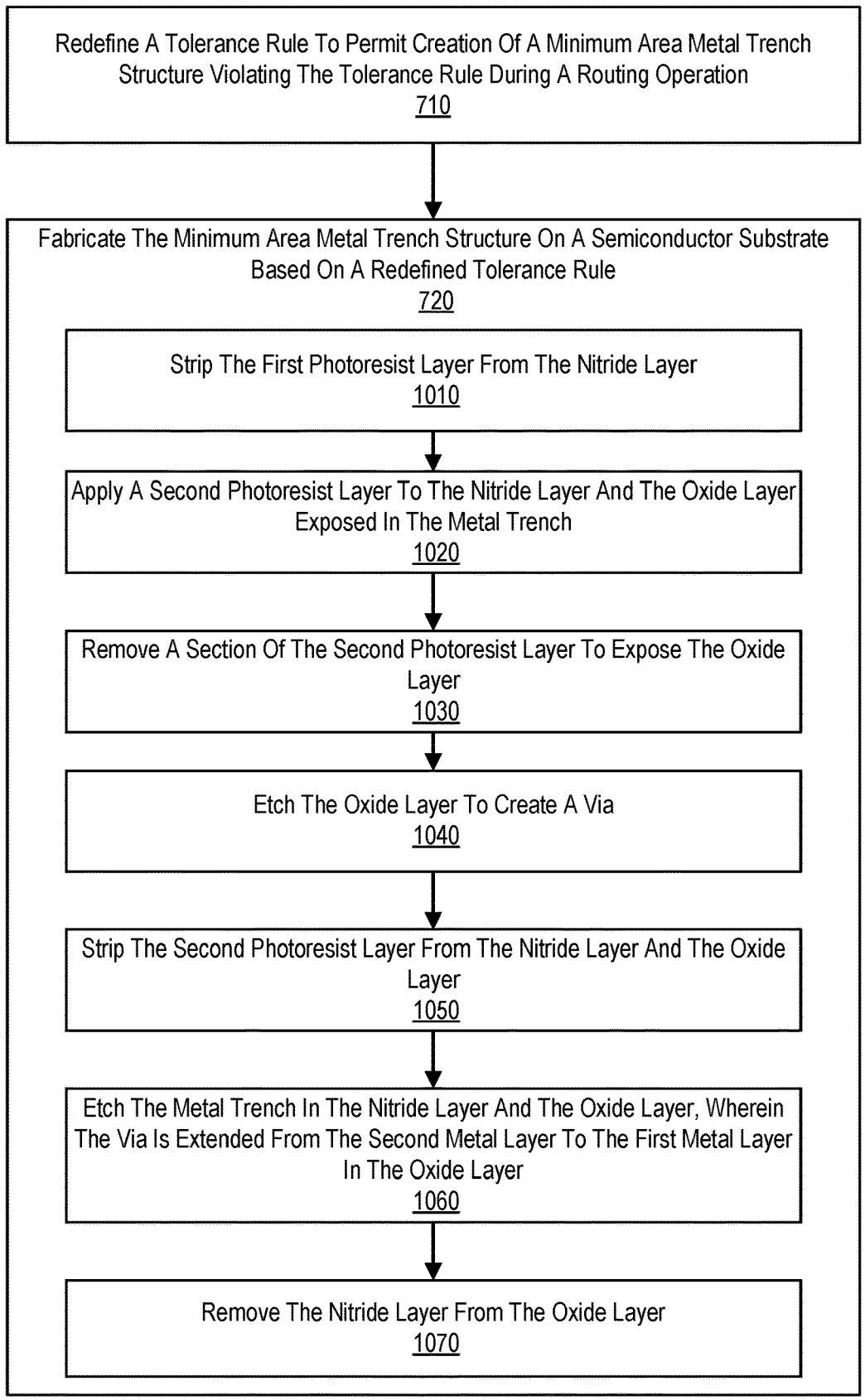
FIG. 10 sets forth a flow chart illustrating another example method for manufacturing a minimum area metal trench structure based on redefined design rules according to some embodiments.

For further explanation, FIG. 10 sets forth a flow chart illustrating an additional example method of manufacturing a minimum area metal trench structure based on redefined design rules to create an otherwise prohibited structure in accordance with some embodiments of the present disclosure. Like the example method of FIG. 7, the example method of FIG. 10 also includes redefining 710 a tolerance rule to permit creation of a minimum area metal trench structure violating the tolerance rule during a routing operation; and fabricating 720 the minimum area metal trench structure on a semiconductor substrate based on a redefined tolerance rule.

The example method of FIG. 10 also includes striping 1010 the first photoresist layer from the nitride layer. The example method of FIG. 10 also includes applying 1020 a second photoresist layer to the nitride layer and the oxide layer exposed in the metal trench. The example method of FIG. 10 also includes striping 1010 the first photoresist layer from the nitride layer. The example method of FIG. 10 also includes applying 1020 a second photoresist layer to the nitride layer and the oxide layer exposed in the metal trench. The example method of FIG. 10 also includes removing 1030 a section of the second photoresist layer to expose the oxide layer. The example method of FIG. 10 also includes etching 1040 the oxide layer to create a via.

In one aspect, as used herein, etching may include any etching technique that selectively removes any material on the semiconductor substrate. Also, a photoresist material may be applied to the material prior to etching to form a "mask" that protects the material from the etching. Once the mask is in place, etching of the material not protected by the mask can occur.

The example method of FIG. 10 also includes stripping 1050 the second photoresist layer from the nitride layer and the oxide layer. The example method of FIG. 10 also includes etching 1060 the metal trench in the nitride layer and the oxide layer, wherein the via is extended from the second metal layer to the first metal layer in the oxide layer. In one aspect, as used herein, a via or "vias" is a small opening in an insulating oxide layer that allows a conductive connection between different layers. The via on an integrated circuit may pass completely through the semiconductor substrate. The example method of FIG. 10 also includes removing 1070 the nitride layer from the oxide layer.

For further explanation, FIG. 11 sets forth a flow chart illustrating an additional example method of manufacturing a minimum area metal trench structure based on redefined design rules to create an otherwise prohibited structure in accordance with some embodiments of the present disclosure. Like the example method of FIG. 7, the example method of FIG. 11 also includes redefining 710 a tolerance rule to permit creation of a minimum area metal trench structure violating the tolerance rule during a routing operation; and fabricating 720 the minimum area metal trench structure on a semiconductor substrate based on a redefined tolerance rule.

The example method of FIG. 11 also includes applying 1110 a conductive layer on the oxide layer and filling the via with the conductive layer. The example method of FIG. 11 also includes polishing 1120 the conductive layer from the oxide layer. The example method of FIG. 11 also includes applying 1130 an additional amount of the oxide layer on the conductive layer, wherein the conductive layer forms a third metal layer with the via, the via electrically connecting the third metal layer to the first metal layer in the oxide layer. In one aspect, as used herein, the conductive layer may be a conductive material such as, for example, copper, a copper alloy, aluminum, an aluminum alloy, cobalt, ruthenium, compounds thereof, combinations thereof, and the like. The conductive layer may have a defined thickness, which may also be manufacturer dependent or defined.

For further explanation, FIG. 12 sets forth a flow chart illustrating an additional example method of manufacturing a minimum area metal trench structure based on redefined design rules to create an otherwise prohibited structure in accordance with some embodiments of the present disclosure. Like the example method of FIG. 7, the example method of FIG. 12 also includes redefining 710 a tolerance rule to permit creation of a minimum area metal trench structure violating the tolerance rule during a routing operation; and fabricating 720 the minimum area metal trench structure on a semiconductor substrate based on a redefined tolerance rule.

The example method of FIG. 12 also includes applying 1210 a photoresist layer to a second metal layer having a first via, the via is self-aligned and is electrically connected to a first metal layer. The example method of FIG. 12 also includes removing 1220 a first section and a second section in the photoresist layer. The example method of FIG. 12 also includes cutting 1230 a first metal trench and a second metal trench in the second metal layer exposed from the first section and the second section in the photoresist layer. In one aspect, the cutting may be one or more techniques for creating the first metal trench such as, for example, an etching operation or other process. Also, a metal trench may be a shallow trench that is etched in a substrate.

For further explanation, FIG. 13 sets forth a flow chart illustrating an additional example method of manufacturing a minimum area metal trench structure based on redefined design rules to create an otherwise prohibited structure in accordance with some embodiments of the present disclosure. Like the example method of FIG. 7, the example method of FIG. 13 also includes redefining 710 a tolerance rule to permit creation of a minimum area metal trench structure violating the tolerance rule during a routing operation; and fabricating 720 the minimum area metal trench structure on a semiconductor substrate based on a redefined tolerance rule.

The example method of FIG. 13 also includes applying 1310 a metal oxide on the second metal layer and filling the first metal trench and the second metal trench. The example method of FIG. 13 also includes removing 1320 the metal oxide from the second metal layer. The example method of FIG. 13 also includes applying 1330 an oxide layer to the second metal layer.

The example method of FIG. 13 also includes apply 1340 a third metal layer to the oxide layer, wherein the third metal layer includes a second via, wherein the second via is a self-aligned via and is electrically connected to the second metal layer.

It should be noted that as described herein, a semiconductor chip can be connected electrically to an adjacent semiconductor chip in another layer by way of a direct connection between the semiconductor chips, or the semiconductor chip can be connected electrically to another semiconductor chip by way of an interconnect chip. The interconnect chip can be constructed of silicon, germanium or other semiconductor materials and be bulk semiconductor, semiconductor on insulator or other designs. The interconnect chip includes multitudes of internal conductor traces (not visible), which can be on multiple levels or a single level as desired. The traces (not visible) interface electrically with conductor structures of the physical layer ("PHY") regions of the semiconductor chips and by way of conducting pathways. The interconnect portions of the semiconductor chips and the interconnect chip, respectively, can have outermost passivation structures (not visible) that can be a laminate of various insulating materials such as, silicon dioxide, silicon nitride, or other dielectric materials. The interconnects can be composed of various conductor materials, such as copper, aluminum, cobalt, ruthenium, or others.

Additionally, the photoresist layers, as described herein, may be formed overlying an intended target material of the wafer. The target material can be an insulative layer, a conductive layer, a barrier layer, or any target material to be etched, doped, treated, processed, or layered. For example, the target material could be, without limitation: polycrystalline silicon; a silicide material; a hard mask layer such as a silicon nitride material; an anti-reflective coating; or any suitable conductive, semiconductive, or insulative material. The photoresist layer may include a variety of photoresist materials, compositions, or chemicals suitable for lithographic applications. The photoresist layer is selected to have photochemical reactions in response to electromagnetic radiation emitted from a radiation source, and to have sufficient transparency to the electromagnetic radiation to allow useful patterning of the photoresist layer. Materials suitable for the photoresist layer may include, among others, a matrix material or resin, a sensitizer or inhibitor, and a solvent. The photoresist layer may be a chemically amplified, positive or negative tone, organic-based photoresist. The photoresist layer may also be a silicon-containing photoresist. For example, the photoresist layer may be an acrylate-based polymer, an alicyclic-based polymer, a phenolic-based polymer, or other suitable materials.

For the various embodiments described here, a layer of photoresist material may be formed over a target material or layer of a semiconductor device structure using any suitable technique. The thickness of a given photoresist layer may be selected according to the particular lithographic technology, e.g., for use in vacuum ultraviolet (VUV) lithography, deep ultraviolet (DUV) lithography, and/or extreme ultraviolet (EUV) lithography (using, for example, exposing light having a wavelength of 193 nm, 157 nm, 126 nm, or 13.4 nm). In this regard, a particular photoresist layer may have a thickness in the range of 15-1000 nm, with a preferred thickness in the range of 50-500 nm.

It will be understood from the foregoing description that modifications and changes can be made in various embodiments of the present disclosure. The descriptions in this specification are for purposes of illustration only and are not to be construed in a limiting sense. The scope of the present disclosure is limited only by the language of the following claims.

What is claimed is:

1. A method for manufacturing a semiconductor chip based on redefining a tolerance rule to create an otherwise prohibited structure, the method comprising:
   redefining a tolerance rule to permit creation of a minimum area metal trench structure violating the tolerance rule during a routing operation;
   replacing an instance of the minimum area metal trench structure in a routing design file with an alternative metal trench structure based on the redefined tolerance rule; and
   fabricating the alternative metal trench structure on a semiconductor substrate based on the routing design file.

2. The method of claim 1, further comprising:
   applying a nitride layer to an oxide layer of the semiconductor substrate, the oxide layer including a first metal layer and a second metal layer; and
   applying a first photoresist layer to the nitride layer.

3. The method of claim 2, further comprising:
   removing a portion of the first photoresist layer from the nitride layer; and
   etching a metal trench in the nitride layer where the portion of the first photoresist layer was removed.

4. The method of claim 3, further comprising:
   striping the first photoresist layer from the nitride layer;
   applying a second photoresist layer to the nitride layer and the oxide layer exposed in the metal trench;
   removing a section of the second photoresist layer to expose the oxide layer; and
   etching the oxide layer to create a via.

5. The method of claim 4, further comprising:
   stripping the second photoresist layer from the nitride layer and the oxide layer; and
   etching the metal trench in the nitride layer and the oxide layer, wherein the via is extended from the second metal layer to the first metal layer in the oxide layer; and
   removing the nitride layer from the oxide layer.

6. The method of claim 5, further comprising:
   applying a conductive layer on the oxide layer and filling the via with the conductive layer; and
   polishing the conductive layer from the oxide layer.

7. The method of claim 6, further comprising applying an additional amount of the oxide layer on the conductive layer, wherein the conductive layer forms a third metal layer with the via, the via electrically connecting the third metal layer to the first metal layer in the oxide layer.

8. The method of claim 7, wherein the third metal layer includes an upper conductive barrier, a lower conductive barrier, and side-wall conductive barriers.

9. The method of claim 1, further comprising:
   applying a photoresist layer to a second metal layer having a first via; and
   removing a first section and a second section in the photoresist layer.

10. The method of claim 9, further comprising:
    cutting a first metal trench and a second metal trench in the second metal layer exposed from the first section and the second section in the photoresist layer.

11. The method of claim 10, wherein the first metal trench and the second metal trench are filled with a conductive material.

12. The method of claim 9, wherein the first via is self-aligned.

13. The method of claim 9, wherein the first via is electrically connected to a first metal layer.

14. The method of claim 10, further comprising:
    applying a metal oxide on a second metal layer.

15. The method of claim 14, further comprising:
    filling the first metal trench and the second metal trench.

16. The method of claim 15, further comprising:
    removing the metal oxide from the second metal layer; and
    applying an oxide layer to the second metal layer.

17. The method of claim 16, further comprising:
    applying a third metal layer to the oxide layer.

18. The method of claim 17, wherein the third metal layer includes a second via.

19. The method of claim 18, wherein the second via is a self-aligned via.

20. A computer program product disposed upon a non-transitory computer readable medium, the computer program product comprising program instructions for manufacturing a semiconductor chip based on redefining a tolerance rule to create an otherwise prohibited structure that, when executed, cause a computer system to:
    redefine a tolerance rule to permit creation of a minimum area metal trench structure violating the tolerance rule during a routing operation; and
    replace an instance of the minimum area metal trench structure in a routing design file with an alternative metal trench structure based on the redefined tolerance rule; and
    fabricate the alternative metal trench structure on a semiconductor substrate based on the routing design file.

\* \* \* \* \*